(12) United States Patent
Fischer et al.

(10) Patent No.: US 6,493,865 B2
(45) Date of Patent: Dec. 10, 2002

(54) METHOD OF PRODUCING MASKS FOR FABRICATING SEMICONDUCTOR STRUCTURES

(75) Inventors: Werner Fischer, Heilsbronn (DE); Burkhard Ludwig, München (DE); Dirk Meyer, Kirchheim (DE); Jörg Thiele, München (DE)

(73) Assignee: Infineon Technologies AG, Munich (DE)

( * ) Notice: Subject to any disclaimer, the term of this patent is extended or adjusted under 35 U.S.C. 154(b) by 8 days.

(21) Appl. No.: 09/829,870

(22) Filed: Apr. 10, 2001

(65) Prior Publication Data

US 2002/0112222 A1 Aug. 15, 2002

(30) Foreign Application Priority Data

Apr. 10, 2000 (DE) .......................................... 100 17 767

(51) Int. Cl.⁷ .............................................. G06F 17/50
(52) U.S. Cl. ......................................... 716/19; 364/491
(58) Field of Search ..................... 716/19, 21; 364/488, 364/491

(56) References Cited

U.S. PATENT DOCUMENTS

| | | | | |
|---|---|---|---|---|
| 5,369,596 A | * | 11/1994 | Tokumaru ..................... | 716/19 |
| 5,792,596 A | | 8/1998 | Yasuzato et al. ............. | 430/327 |
| 5,801,954 A | * | 9/1998 | Le et al. ....................... | 382/144 |
| 5,815,685 A | | 9/1998 | Kamon ........................ | 395/500 |
| 5,895,741 A | | 4/1999 | Hasegawa et al. ............. | 430/5 |
| 6,045,981 A | | 4/2000 | Matsunaga et al. ........... | 430/530 |
| 6,263,477 B1 | * | 7/2001 | Kobayashi ................... | 365/218 |
| 6,340,542 B1 | * | 1/2002 | Inoue et al. .................... | 430/5 |

FOREIGN PATENT DOCUMENTS

| | | |
|---|---|---|
| DE | 198 18 440 A1 | 10/1999 |
| TW | 372 283 | 10/1999 |
| TW | 376 465 | 12/1999 |

OTHER PUBLICATIONS

"Graph–Optimization Techniques for IC Layout and Compaction" (Kedem et al.), IEEE Transactions on Computer–Aided Design, vol. CAD–3, No. 1, Jan. 1984, pp. 12–19.
Gershon Kedem et al.: "Graph–Optimization Techniques for IC Layout and Compaction", IEEE Transactions on Computer–Aided Design, vol. CAD–3, No. 1, Jan. 1984.

* cited by examiner

*Primary Examiner*—Don Wong
*Assistant Examiner*—Thuy Vinh Tran
(74) *Attorney, Agent, or Firm*—Laurence A. Greenberg; Werner H. Stemer; Ralph E. Locher

(57) ABSTRACT

Masks are produced for the fabrication of semiconductor structures based on layout data that has information for defining a mask layout with individual geometric structure elements. Layout data generated previously for a mask layout is checked to see whether geometric design requirements are satisfied. In the event of a violation of design requirements, the corresponding error locations in the mask layout are located. Further layout data are then generated, which contain information for defining correction figures to correct the respective error locations. The further layout data are linked with the layout data, so that the layout data are modified. This permits automated modification of the layout data and their technology-dependent optimization.

12 Claims, 4 Drawing Sheets

METHOD OF PRODUCING MASKS FOR FABRICATING SEMICONDUCTOR STRUCTURES

BACKGROUND OF THE INVENTION

FIELD OF THE INVENTION

The invention lies in the semiconductor technology field. More specifically, the present invention relates to a process for producing masks for the fabrication of semiconductor structures, in which the production of a mask is carried out using layout data which contains information for defining a mask layout having individual geometric structure elements.

In the area of the fabrication of semiconductor structures, for example during the production of integrated circuits based on semiconductor wafers, a large number of individual areas, for example conductor tracks, are subdivided onto the semiconductor wafers. This structuring is carried out with the aid of the lithographic technique in which, in particular, masks or mask structures are generated which are used for the production of semiconductor structures belonging to the integrated circuit in subsequent process steps. During the production of masks or mask structures, the main objective consists in particular in generating a large number of structures on the semiconductor wafer true to size, in correct positions and without defects.

The continuous decrease in the dimensions in the production of integrated circuits increasingly demands auxiliary structures, as they are known, or modifications of the mask structures generated during the drafting of the respective mask, in order that the feasibility of producing the mask to be produced is ensured. Auxiliary structures are used, for example, for planarization. They are electrically non-active and, at the same time, permit a certain amount of geometric freedom in drafting the corresponding mask structure. Examples of technological advantages which are achieved by the modification of mask structures are improvements in the imaging properties, enlargement of the process window (process window as a general term for the admissible scatter of process parameters), improvements in the planarization properties, increases in yield or more robust designs.

In processes for producing masks, the production of a mask is usually carried out using generated layout data which contains information for defining a mask layout. In this case, the mask layout has individual geometric structure elements, which represent the mask structures. It is often the case, during the generation of the layout data, that the generation of a number of mask levels is necessary in order to optimize the fabrication process.

With the increasing complexity of the mask layout or of the layout data about a mask to be produced, and given the decrease in the dimensions, it becomes more difficult and more time-consuming to carry out modifications to the mask structures or the layout data during the mask generation, for example manually, in order that the feasibility of production of the mask is ensured. At the same time, generation errors in layout data are to be eliminated. For this purpose, it is necessary to perform technology-dependent optimization of the layout data.

SUMMARY OF THE INVENTION

The object of the present invention is to provide a method of producing masks for the fabrication of semiconductor structures which overcomes the above-noted deficiencies and disadvantages of the prior art devices and methods of this general kind, and wherein the modification of generated layout data about a mask to be produced is carried out in order to eliminate generation errors, so that the feasibility of producing the mask is ensured and which permits relatively quick modification of the layout data and its technology-dependent optimization.

With the above and other objects in view there is provided, in accordance with the invention, a method of producing masks for fabricating semiconductor structures, which comprises:

generating layout data with information defining a mask layout with individual geometric elements;

defining geometric design requirements and an arrangement for the individual structure elements;

checking the layout data as to whether the geometric design requirements and the arrangement for the individual structure elements are satisfied;

if the design requirements are not satisfied, locating corresponding error locations in the mask layout using the layout data;

generating further layout data with information for defining correction figures to correct the respective error locations; and linking the layout data with the further layout data for modifying the layout data.

In accordance with an added feature of the invention, the further layout data are generated by modifying the layout data at the respective error locations.

In accordance with an additional feature of the invention, the layout data are generated for a single mask level or for a plurality of mask levels, and performing the method for each of the mask levels.

In sum, the above objects are achieved by a process for producing masks for the fabrication of semiconductor structures, in which the production of a mask is carried out using layout data which contains information for defining a mask layout which has individual geometric structure elements. The novel method includes the following steps:

layout data about a mask layout to be produced are generated;

geometric design requirements for individual structure elements and their disposition are defined;

the layout data are checked to see whether the geometric design requirements for the individual structure elements and their disposition are satisfied;

in the event that the design requirements are violated, the corresponding error locations in the mask layout are located using the layout data;

further layout data are generated which contain information for defining correction figures to correct the respective error locations; and the layout data are linked with the further layout data so that the layout data are modified.

In order to carry out the process, use is made of the fact that the structure elements and their design requirements may be characterized by so-called situation-describing attributes. For example, isolated lines are distinguished by the attribute that, at a specific spacing, they are not adjacent structures. Structures for specific mask levels for improving the planarization properties are described by the attribute of an adequately large structure on the mask level to be planarized. Such attributes can be found and classified using software for physical verification (for example "Vampire"). These classified attributes are also referred to as "markers". These markers are then used to modify the layout data as a function of the situation.

As described in the introductory text above, during the generation of layout data about a mask to be produced, generation errors are produced because of higher and higher requirements relating to the production of integrated circuits, and said generation errors violate defined design requirements. Such generation errors are, for example, violations of the spacing or width of the structure elements of the mask layout. Once the corresponding error locations have been located in the mask layout, they are corrected by superimposing correction figures, which are intended to have the effect of eliminating the violation of the design requirements. In this connection, it is also possible to speak of repairing a data state in the mask design by means of so-called repair figures.

The further layout data, which contain the information for defining the correction figures are therefore generated with reference back to the mask requirements. The further layout data are, for example, generated by modifying the layout data at the respective error locations. Once layout data about a mask to be produced have been generated for one or more mask levels, then the process can advantageously be carried out for each of the mask levels.

The method according to the invention permits the errors produced during the generation of the layout data about a mask to be produced to be rectified completely, fully automatically and in accordance with technologically predefined optimization criteria. At the same time, the process can be integrated relatively simply into existing standard design flows. It is possible for various technological boundary conditions for the generation of the layout data to be predefined, so that a solution optimized in accordance with these boundary conditions can be found. At the same time, the process can be configured in such a way that manual reworking can be dispensed with, which means that the process is accelerated overall.

The generation errors can be eliminated by adding correction figures at the corresponding error locations or by cutting back the structure elements at the error locations. In the first case, the layout data at the respective error locations are linked additively to the further layout data in order to define the correction figures. In the second case, the layout data at the respective error locations are linked subtractively with the further layout data (subtractive correction figures).

By adding correction figures, the original mask layout or its structure elements and their disposition can be changed. As described at the beginning, during the fabrication of auxiliary structures belonging to an integrated circuit and electrically non-active in the integrated circuit, there is a certain amount of geometric freedom in configuring the structure elements and in their disposition. The method according to the invention can therefore advantageously be employed to produce masks which are used for fabricating auxiliary structures in an integrated circuit.

If the process is used to produce masks for fabricating semiconductor structures belonging to an integrated circuit, the structures being electrically active, then when the process is being carried out, care must be taken that the so-called connectivity relationships between the structure elements of the mask are not changed during the modification of the layout data.

In order to avoid repeated correction or repair of identical configurations with regard to propagation time and memory resources, it is advantageous to make use of an existing hierarchical structure of the layout data. To this end, by using the process, the layout data is modified successively in accordance with its hierarchical structure, taking account of the respective geometric context. At the same time, account is taken of the fact that individual structure elements or their disposition in the mask layout repeat regularly and, in so doing, can be combined to form a higher-order functional group in a hierarchical structure. If a correction of such a functional group at a specific hierarchical level is made, it is then advantageous to apply this directly to other comparable functional groups at the same or higher hierarchical levels, taking into account the geometric context of the respective functional group.

In order to avoid repeated, complicated solving of identical generation faults or optimization problems, it is advantageous to store the geometric configurations with associated correction figures in a data library and to reuse the results. For this purpose, the layout data about a mask to be produced, and the respectively associated further layout data for defining associated correction figures, are stored in a data library.

In accordance with another feature of the invention, the steps of checking the layout data, checking a location of the error locations, generating the further layout data, and linking the layout data with the further layout data are successively carried out until no more design requirements are violated. In other words, all the errors which are produced during the modification of the layout data (so-called secondary errors) are eliminated iteratively. To this end, the steps of checking the layout data, the location of the error locations, the generation of the further layout data and the linking of the layout data with the further layout data are carried out successively until no design requirements are violated any more. Existing secondary errors are therefore eliminated by the repeated application of the checking and modification steps.

In accordance with again another feature of the invention, the method also comprises:

generating the further layout data by edges of the correction figures being configured;

using a geometric context of the configured edges to set up inequalities for the edges of the correction figures describing potential positions of the edges;

setting up an optimization criterion relating to the geometric requirements on the correction figures;

applying a mathematical optimization method to determine the respective positions of the edges, so that in each case the inequalities set up and the optimization criterion are satisfied; and defining the correction figures by the determined positions of the edges.

In other words, in this further embodiment of the method according to the invention, the correction figures are configurable. To this end, the further layout data are generated in such a way that the edges of the correction figures are configured. From the geometric context of the configured edges, inequalities for the edges of the correction figures are set up, said inequalities describing the potential positions of the edges. An optimization criterion relating to the geometric requirements on the correction figures is set up. In order to determine the respective positions of the edges, a mathematical optimization method is applied, so that in each case the inequalities set up and the optimization criterion are satisfied. As a result, the correction figures are defined by the determined positions of the edges. With this embodiment of the process, the correction figures can be generated in a context-dependent manner and in accordance with the optimization criteria and precisely in the form needed. In this way, no secondary errors are produced.

Other features which are considered as characteristic for the invention are set forth in the appended claims.

Although the invention is illustrated and described herein as embodied in a process for producing masks for the fabrication of semiconductor structures, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

For the exemplary embodiments illustrated below, for the purpose of clarification, only generation errors with violations of the spacing between the individual structure elements on the mask to be produced will be considered. Two processes will be listed by which violations of the spacing can be eliminated by adding correction figures. The processes can be expanded in a similar way for the simultaneous elimination of width violations and for the elimination of violations of other geometric design requirements. In a similar way, for example, violations of spacing and width can also be eliminated by cutting back structure elements (subtractive correction figures).

Figure 1:
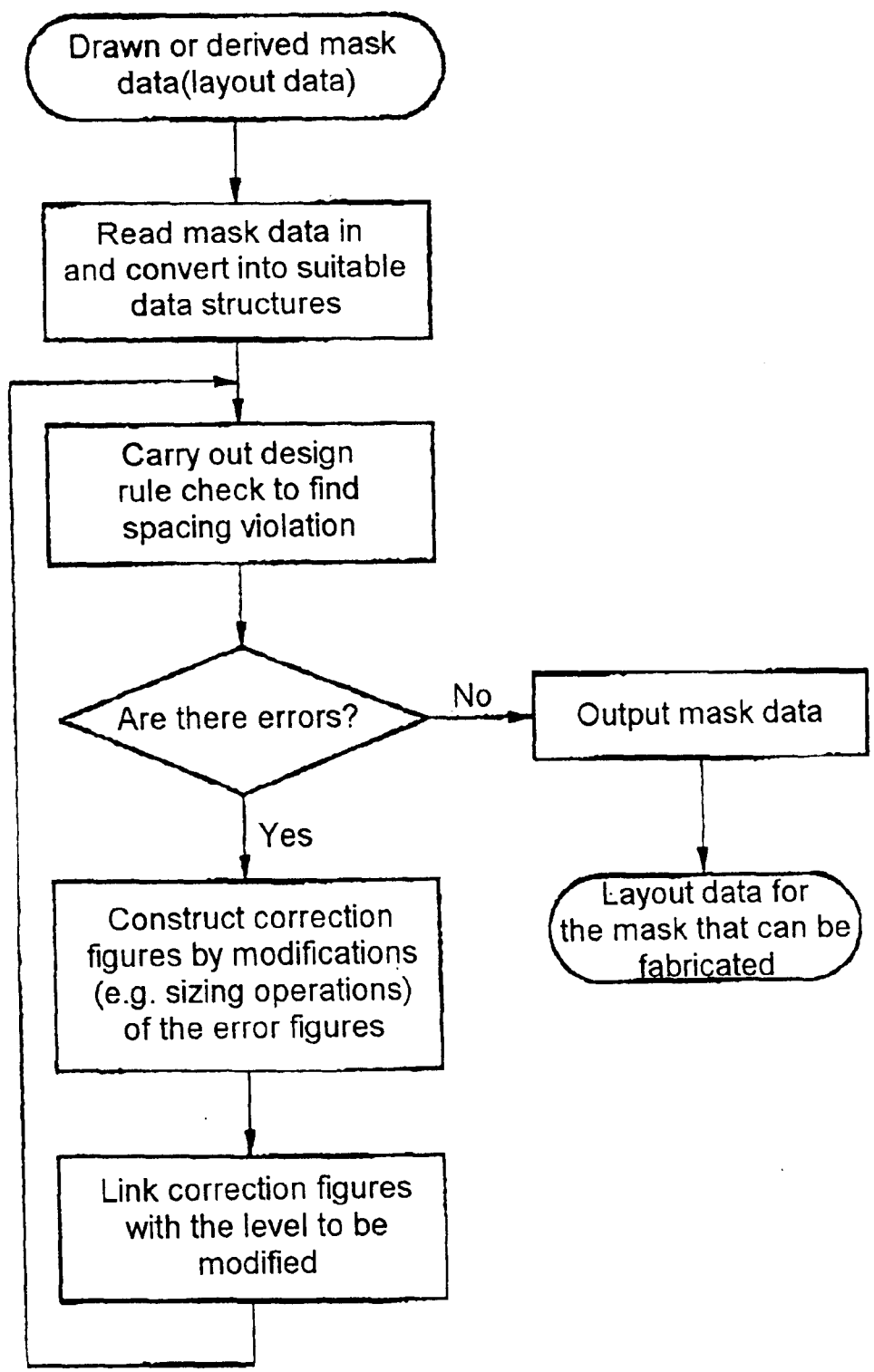
FIG. 1 is a flow diagram of one embodiment of the method according to the invention.

Referring now to the figures of the drawing in detail and first, particularly, to FIG. 1 thereof, generation errors in the form of spacing violations are eliminated by the repeated application of checking and modification steps. In order to modify the layout data of the individual error locations (error figures), individual operations such as "sizing" or a sequence of geometric operations are expedient. Here, it is advantageous to take into account the geometric context of the respective error figure as far as possible. For example, the edges present at the respective error figure are taken into account when modifying the respective error figure.

As can be gathered from FIG. 1, first of all, layout data about a mask to be produced are generated in the form of drawn or derived mask data. These are read into a processing device for further processing and converted into suitable data structures. In addition, geometric design requirements for the individual structure elements of the mask layout and their disposition are defined. As the process proceeds, the masks read in are checked to see whether the geometric design requirements for the individual structure elements and their disposition have been satisfied. A so-called design rule check is therefore carried out, for example by means of verification software, in order to find spacing violations. In the event that design requirements are violated, the corresponding error locations in the mask layout are located using the layout data. Further layout data are then generated to define correction figures. These figures can be constructed, for example, by means of modifications, such as sizing operations, on the error figures. The layout data of the level to be modified are then linked with the further layout data or the correction figures, so that the layout data are modified. According to FIG. 1, the aforementioned steps are carried out successively until no design requirements are violated any more. If the mask data generated in this way are output, the layout data about the mask that can be fabricated are then available.

Figure 2:
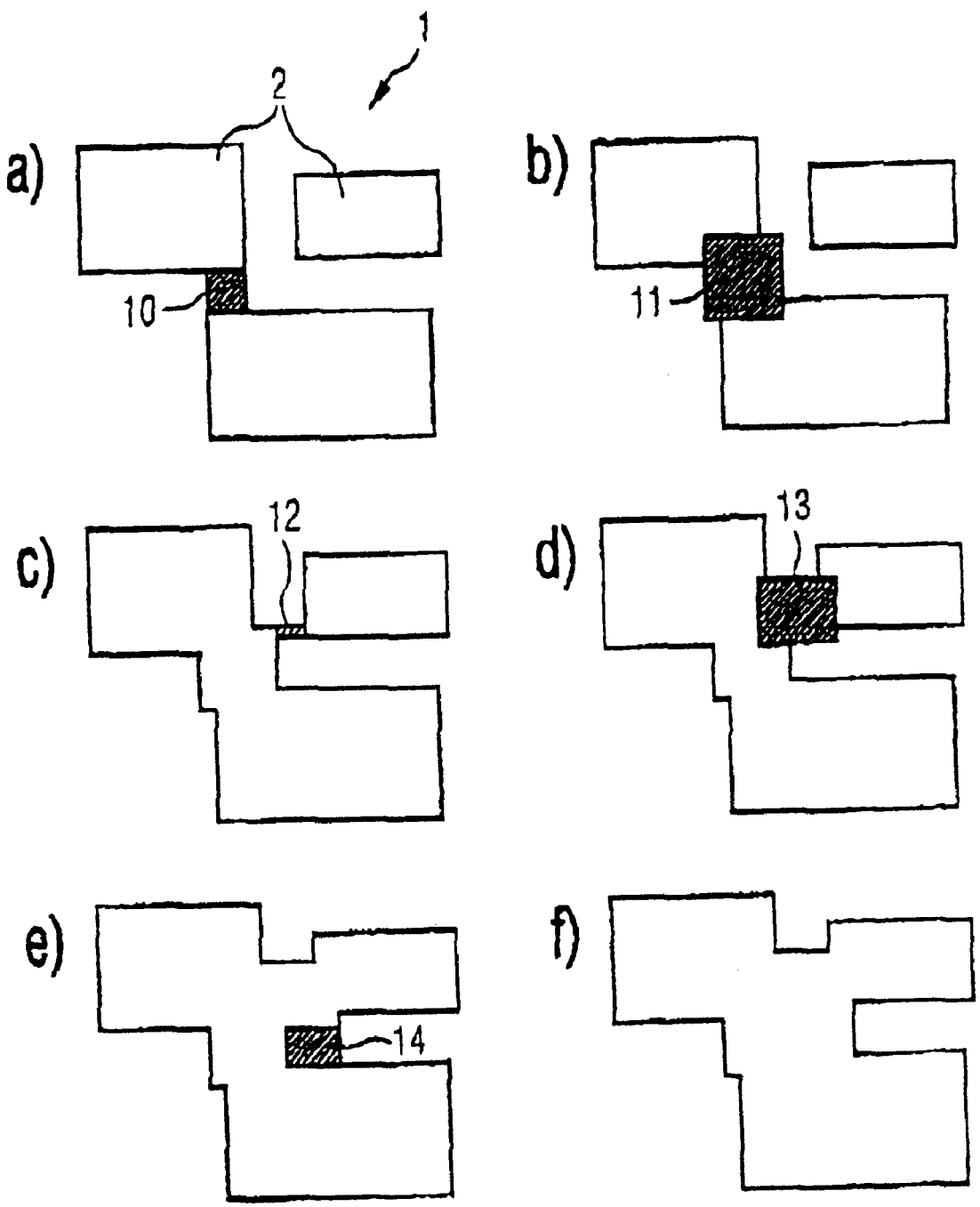
FIG. 2 is a diagram of a geometric example of carrying out the method according to FIG. 1.

FIG. 2a illustrates a configuration of a mask layout 1 with structure elements 2 which has a spacing violation in the form of the error location or the error figure 10. As FIG. 2b shows, the error figure 10 is modified so that the correction figure 11 is generated. This is linked with the existing structure elements, as shown in FIG. 2c. This produces a new configuration after the first iteration step having a new spacing violation in the form of the error figure 12. The error figure 12 is modified, in the same way as described above, by superimposing the correction figure 13 (FIG. 2d). As FIG. 2e shows, a new configuration is produced after this second iteration step, with a new spacing violation in the form of the error figure 14. By means of the new superimposition of a corresponding correction figure, the configuration that can be fabricated is produced without any spacing violations after three iteration steps, as illustrated in FIG. 2f.

Figure 3:
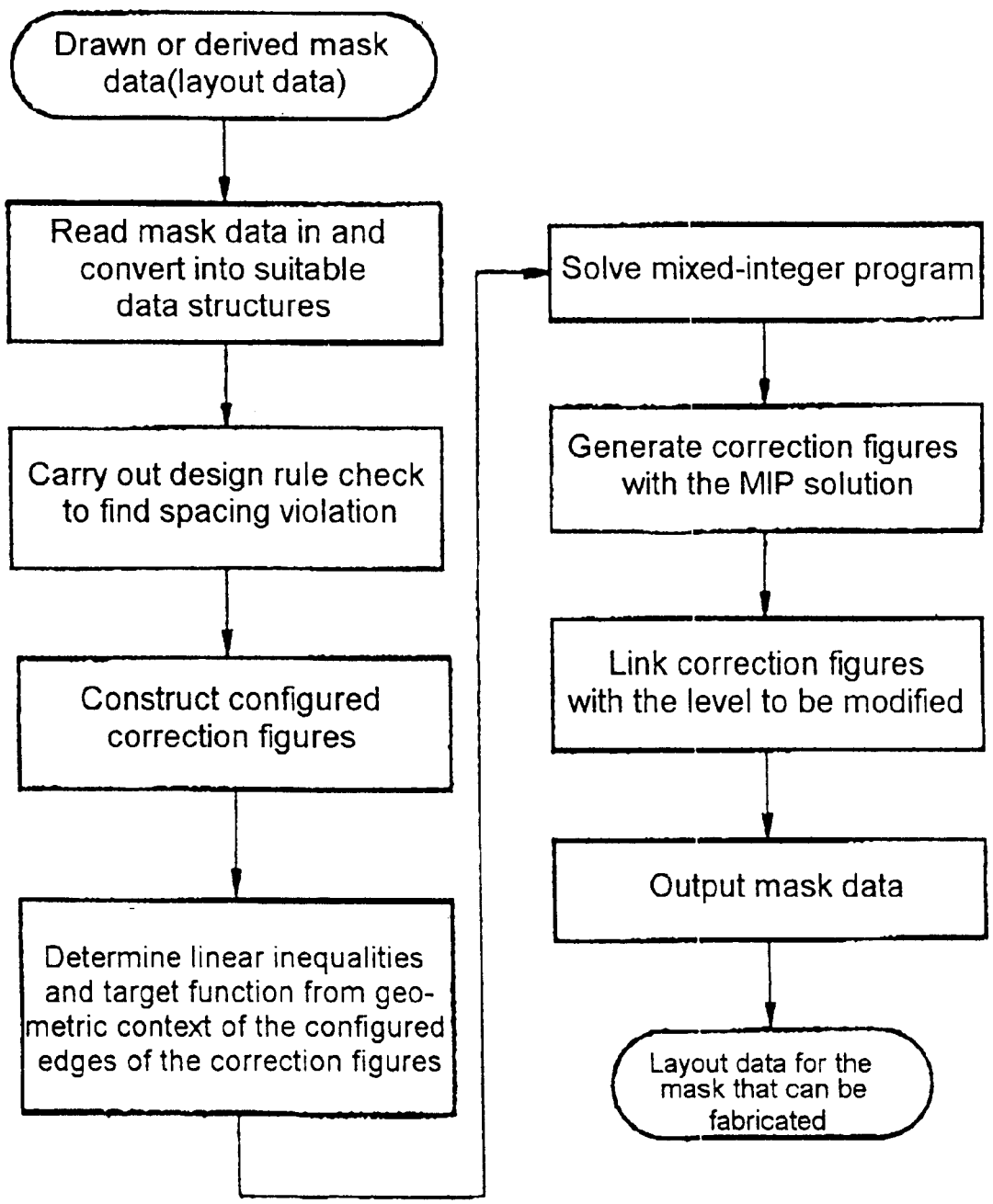
FIG. 3 is a flow diagram of a further embodiment of the method according to the invention.

In the exemplary embodiment according to FIG. 3, generation errors are eliminated by means of configurable correction figures. For the edges of the correction figures, said edges being orthogonal in this example, geometric operations are used to set up conditions in the form of linear inequalities which describe possible positions of the edges. For example, the initial position of each individual edge can be selected freely within a certain range, but the conditions between the edges are given by the inequalities.

The layout data is generated and read in in a similar way to that in the example of FIG. 1. Following the checks to see whether the geometric design requirements for the individual structure elements have been satisfied, configurable correction figures are generated in the event of an error. These figures are initially generated in such a way that the edges of the correction figures are configured. By using the geometric context of the configured edges, the linear equalities for the edges of the correction figures are set up, and describe potential positions of the edges. In addition, an optimization criterion or a target function relating to the geometric requirements on the correction figures is set up. With the aid of a mathematical optimization method, for example, a so-called mixed-integer programming method, positions of the edges of the correction figures are determined which satisfy the inequalities set up and the optimization criterion. The correction figures are therefore defined by the determined positions of the edges. Using the solution from the mixed-integer programming method (MIP), correction figures are generated. These are linked with the level to be modified, as described in the previous exemplary embodiment.

The optimization criterion is, for example, a linear polynomial in the variables used to describe possible edge positions. For example, the optimization criterion specifies that the edges of the correction figures, starting from their initial position, are shifted as little as possible. Another optimization criterion specifies, for example, that the areas of the correction figures are as small as possible. In this way, different variants of an optimization criterion can be set up, so that different geometric requirements on the correction figures can be optimized.

For this purpose, for example, known methods of layout compaction can be used (such as those from Kedem et al., "Graph-Optimization Techniques for IC Layout and Compaction", IEEE Transactions on Computer-Aided Design, Vol. CAD-3, No. 1, January 1984). The optimization criteria can be adapted to various technological and design boundary conditions, as can the inequalities.

Figure 4:
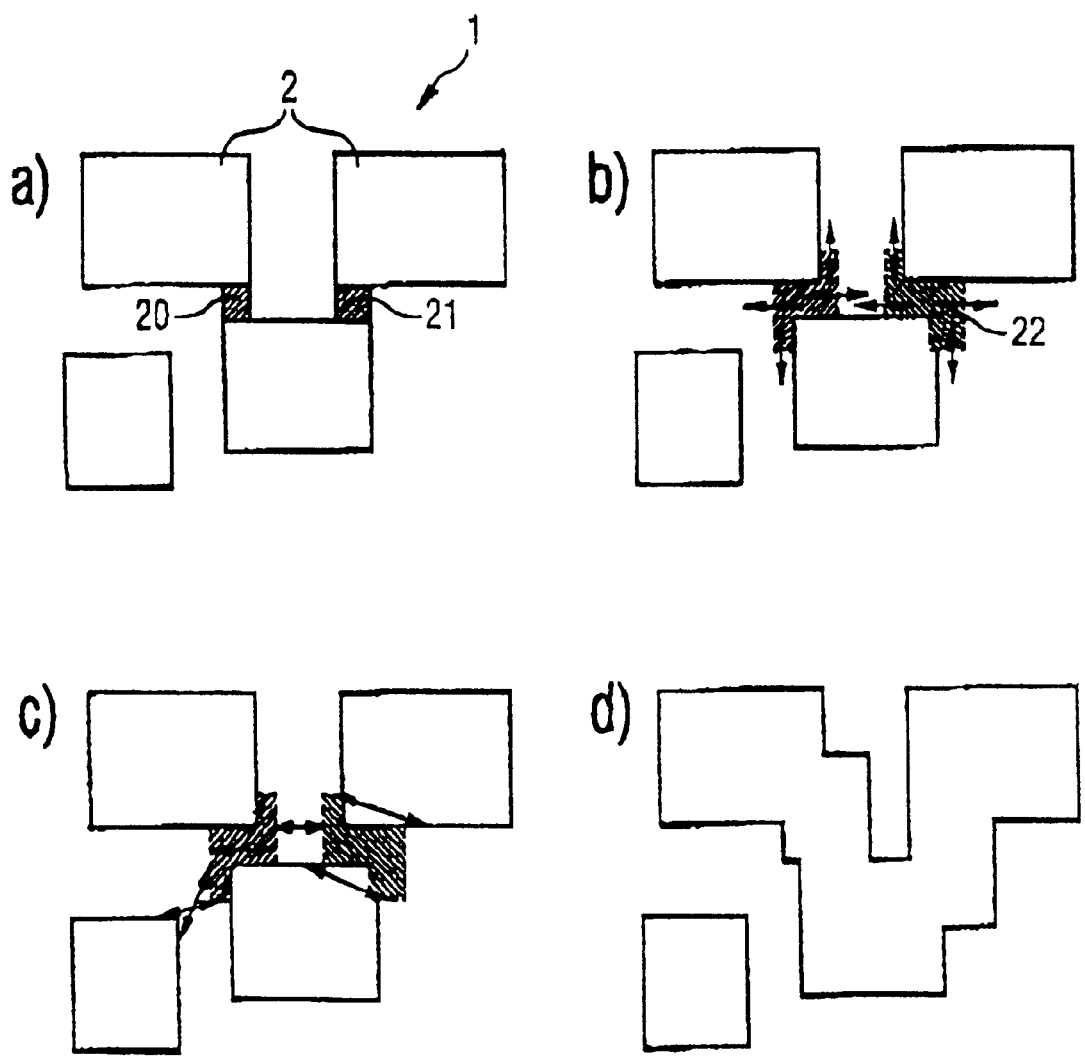
FIG. 4 is a diagram of a geometric example of carrying out the method according to FIG. 3.

FIG. 4a shows a configuration of a mask layout 1 having structure elements 2 with spacing violations in the form the error figures 20 and 21. As FIG. 4b shows, correction figures 22 are generated with configurable edges. In this case, the position of each of the edges can be selected freely over a certain range, the conditions between the edges are given by the inequalities set up. FIG. 4c illustrates examples of relationships between the edges for determining the inequalities and the target function. By applying the mathematical optimization method, the individual correction figures are determined in such a way that no spacing violation occurs any more, it also being possible here for secondary width violations to be avoided. FIG. 4d shows a configuration that can be fabricated, without any spacing violations. Since the respective correction figures are generated by means of specific configuration, under certain circumstances, higher accuracy can be achieved as compared with the iterative process.

We claim:

1. A method of producing masks for fabricating semiconductor structures, which comprises:

generating layout data with information defining a mask layout with individual geometric elements;

defining geometric design requirements and an arrangement for the individual structure elements;

checking the layout data as to whether the geometric design requirements and the arrangement for the individual structure elements are satisfied;

if the design requirements are not satisfied, locating corresponding error locations in the mask layout using the layout data;

generating further layout data with information for defining correction figures to correct the respective error locations; and linking the layout data with the further layout data for modifying the layout data.

2. The method according to claim 1, wherein the further layout data are generated by modifying the layout data at the respective error locations.

3. The method according to claim 1, which comprises generating the layout data for a single mask level.

4. The method according to claim 1, which comprises generating layout data for a plurality of mask levels, and performing the method for each of the mask levels.

5. The method according to claim 1, which comprises successively carrying out the steps of checking the layout data, checking a location of the error locations, generating the further layout data, and linking the layout data with the further layout data until no design requirements is violated.

6. The method according to claim 1, which comprises:

generating the further layout data by edges of the correction figures being configured;

using a geometric context of the configured edges to set up inequalities for the edges of the correction figures describing potential positions of the edges;

setting up an optimization criterion relating to the geometric requirements on the correction figures;

applying a mathematical optimization method to determine the respective positions of the edges, so that in each case the inequalities set up and the optimization criterion are satisfied; and defining the correction figures by the determined positions of the edges.

7. The method according to claim 6, wherein the mathematical optimization method is a mixed-integer programming method.

8. The method according to claim 1, wherein the linking step comprises additively linking the layout data with the further layout data.

9. The method according to claim 1, wherein the linking step comprises subtractively linking the layout data with the further layout data.

10. The method according to claim 1, which comprises storing the layout data and respectively associated further layout data in a data library.

11. The method according to claim 1, wherein the layout data has a hierarchical structure and the layout data are modified by using the method successively according to the hierarchical structure, taking into account a respective geometric context.

12. The method according to claim 1, which comprises forming a mask for fabricating auxiliary structures belonging to an integrated circuit but forming structures that are not electrically active in the integrated circuit.

* * * * *